US006462865B1

(12) United States Patent
Chu et al.

(10) Patent No.: US 6,462,865 B1
(45) Date of Patent: Oct. 8, 2002

(54) ALL-OPTICAL LOGIC WITH WIRED-OR MULTI-MODE-INTERFERENCE COMBINERS AND SEMICONDUCTOR-OPTICAL-AMPLIFIER INVERTERS

(75) Inventors: Tzu-Yih Chu, San Jose, CA (US);
Shyang Chang, Hacienda, CA (US);
Chi Au, Union City, CA (US);
Abraham C. Ma, Fremont, CA (US)

(73) Assignee: Super Light Wave Corp., San Jose, CA (US)

( * ) Notice: Subject to any disclaimer, the term of this patent is extended or adjusted under 35 U.S.C. 154(b) by 0 days.

(21) Appl. No.: 09/681,964

(22) Filed: Jun. 29, 2001

(51) Int. Cl.[7] ................................................ H01S 3/00
(52) U.S. Cl. ...................................... 359/344; 359/108
(58) Field of Search ................................. 359/344, 108

(56) References Cited

U.S. PATENT DOCUMENTS

| | | | |
|---|---|---|---|
| 3,849,740 A | 11/1974 | Brandt | 331/94.5 C |
| 4,930,873 A | 6/1990 | Hunter | 350/354 |
| 5,059,788 A | * 10/1991 | Tashiro et al. | 250/213 |
| 5,119,227 A | 6/1992 | Dawson et al. | 359/244 |
| 5,414,789 A | 5/1995 | Tamil et al. | 385/122 |
| 5,434,701 A | 7/1995 | Fatehi et al. | 359/341 |
| 5,537,243 A | 7/1996 | Fatehi et al. | 359/541 |
| 5,541,443 A | 7/1996 | Lee et al. | 250/551 |
| 5,580,818 A | 12/1996 | Sakata | 437/129 |
| 5,600,479 A | 2/1997 | Evans | 359/237 |
| 5,654,812 A | 8/1997 | Suzuki | 359/139 |
| 5,742,045 A | 4/1998 | Parker et al. | 250/214 |
| 5,825,525 A | 10/1998 | Harwit | 359/248 |
| 5,878,181 A | 3/1999 | Van Der Tol | 385/122 |
| 5,999,284 A | 12/1999 | Roberts | 359/108 |
| 6,035,079 A | * 3/2000 | Fields et al. | 385/19 |
| 6,081,470 A | 6/2000 | Vaccaro et al. | 365/215 |

FOREIGN PATENT DOCUMENTS

EP     0 660 161 A1   *  6/1995
JP       04245812 A   *  9/1992

OTHER PUBLICATIONS

Soldano & Pennings, "Optical Multi–Mode Interference Devices Based on Self–Imaging: Principles and Applications", IEEE J. Lightwave Tech, vol. 13, No. 4, 4/95 pp. 615–627.

Lee, et al., "Theoretical Study of Frequency Chirping and Extinction Ratio of Wavelength–Converted Optical Signals by XGM and XPM Using SOA's", IEEE J. Quant Elect. vol. 35, No. 8, 8/99, pp. 1213–1219.

Leuthold et al. "Multimode Interference Couplers for the Conversion and Combining of Zero–and First–Order Modes", IEEE J. Lightwave Tech, vol. 16, No. 74, 7/98 pp. 1228–1239.

Nesset et al., "All–Optical Wavelength Conversion Using SOA Nonlinearities", IEEE Communications Mag, 12/98, pp. 56–61.

Durhuus et al., "All–Optical Wavelength Conversion by Semiconductor Optical Amplifiers", IEEE J. Lightwave Tech, vol. 14, No. 6, 6/96, pp. 942–954.

Kloch et al. "Wavelenth Converters", IEEE Trans. Electron, vol. E82–C, No. 8, 8/99, pp. 1475–1486.

\* cited by examiner

Primary Examiner—Mark Hellner
(74) Attorney, Agent, or Firm—Stuart T. Auvinen

(57) ABSTRACT

A novel semiconductor optical amplifier (SOA) can operate as an optical inverter as well as a power-restoring device. Together, an optical-OR and the optical inverter can provide a wide variety of high speed optical logic gates and functions. The optical inverter uses cross-gain modulation (XGM) to invert a modulated signal on a first input, to produce an inverted output. The inverse of the modulation is transferred from a first wavelength of the modulated first input to a second wavelength of a continuous-wave second input. A filter can then block the first wavelength, allowing the inversely-modulated second wavelength to be output as the inverted output. The first and second wavelengths are swapped in alternate inverters in a logic path. The Y-junction can be implemented as a Multi-Mode Interference (MMI) device.

18 Claims, 4 Drawing Sheets

OR GATE

ALL-OPTICAL LOGIC WITH WIRED-OR MULTI-MODE-INTERFERENCE COMBINERS AND SEMICONDUCTOR-OPTICAL-AMPLIFIER INVERTERS

BACKGROUND OF INVENTION

This invention relates to all-optical logic elements, and more particularly to the use of semiconductor optical amplifiers (SOA) and multi-mode interference (MMI) devices in optical logic gates.

Since photons travel faster than electrons, much effort has gone into trying to develop an optical computer or optical logic elements. For example, U.S. Pat. No. 4,262,992 sets forth a variable integrated optical logic element, U.S. Pat. No. 5,434,701 discloses an all-optical inverter, U.S. Pat. No. 6,035,079 reveals a saturable absorber based optical inverter, and U.S. Pat. No. 5,004,314 sets forth a optical signal modulation device.

Different approaches have been taken to developing optical logic and other elements of a computer. Most of these approaches have proven to be difficult to produce, expensive, or bulky. Some examples are U.S. Pat. No. 3,849,740 sets forth an integrated optical AND/OR gate, and U.S. Pat. No. 5,315,422 discloses an optical logic element which performs an XOR operation. Optical logic gates are disclosed, for example, in U.S. Pat. Nos. 5,999,283; 5,742,045; 5,541,443; and 5,414,789. Optical flip-flops are described in U.S. Pat. Nos. 4,930,873 and 5,537,243. An optical latching device using an interferometer is shown in U.S. Pat. No. 5,999,284. A switching function using intra-pulse Raman scattering is described in U.S. Pat. No. 5,600,479. Other optical switches include those described in U.S. Pat. Nos. 5,970,155; 5,703,975; and 5,119,227. An optical semiconductor image storage apparatus is disclosed in U.S. Pat. No. 6,081,470.

Another area of optical development is in telecommunications. Developments here have been more commercially successful. The types of optical elements are different since the emphasis is on transmission of optical data, switching, and combining multiple optical data streams. In addition, amplification and regeneration of signals for long-distance transmission is important.

One challenge in telecommunications is wavelength conversion in the transmission path. Wavelength conversion can be accomplished with a semiconductor optical amplifier (SOA) configured in a cross-gain modulation (XGM) mode. See, for example, the article Wavelength Converters by Allan Kloch et al, IEICE Trans. Electron., Vol. E82-C, No. 8, August 1999, pp. 1475–1486.

Another device is used to control power in an optical waveguide, and is called a multiple quantum well (MQW). Such a device can also be used as a switch. An example is set forth in U.S. Pat. Nos. 5,754,714 and 5,920,588. An example of a Y-junction is set forth in U.S. Pat. No. 5,580,818, showing the combining of two optical waveguides into one. Other examples of optical elements in communication systems are set forth in U.S. Pat. Nos. 5,798,853; 5,654,812; 5,751,758; and 5,825,517 (showing a cross-connect switch).

While these devices are somewhat useful, more flexible optical logic gates are desired.

DETAILED DESCRIPTION

Figure 1:
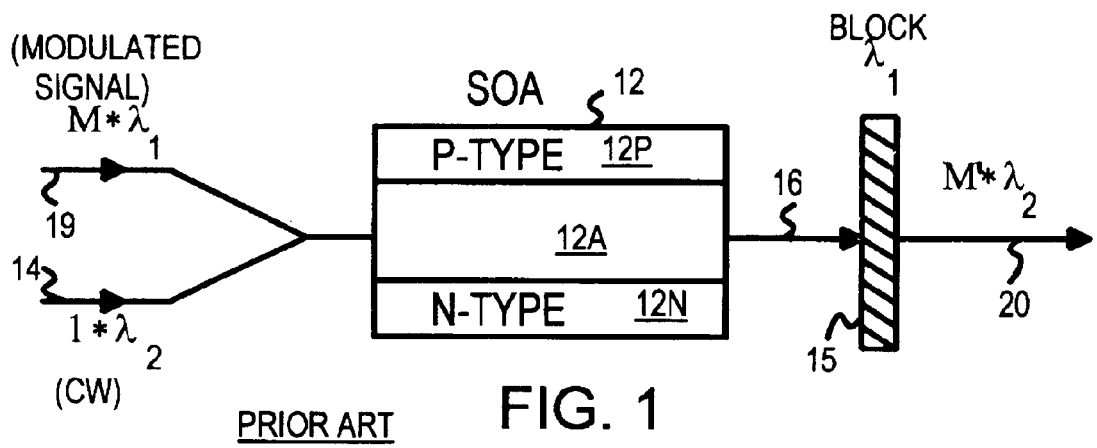
FIG. 1 illustrates a prior-art wavelength converter.

The present invention relates to an improvement in all-optical logic gates. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have recognized that arbitrary logic can be constructed from an inverter and a 2-input OR gate. Large optical computers and smaller optical logic and control units could then be feasible. The inventors have realized that an optical Y-junction can operate like a wired-OR gate in digital-electronic logic, while a semiconductor optical amplifier (SOA) can operate like an optical inverter, providing an inversion function. Together, the optical-OR junction and the optical inverter allow for a wide variety of digital logic gates and functions to be implemented.

Rather than use a basic Y-junction, a multi-mode interference (MMI) device acts as a junction, combining two optical input signals to generate one or more optical output signals. MMI devices are optical directional couplers that use the self-imaging or interferometric properties of a small optical cavity or planar waveguide to pass optical signals from an input opening to one or more output openings. Constructive and destructive interference of the two inputs occurs within the waveguide. The length and width of the waveguide relative to the input wavelength are design parameters. The locations of output openings in the waveguide can be carefully designed to be located at an interference maxima.

An optical input wave-guide can be an optical fiber, such as a strand of a fiber-optic cable, or a guide formed on a substrate, such as a groove or a transparent layer formed on the substrate. Two wave-guides A, B can connect together at a 3-way MMI device that has a third wave guide C as an output.

The optical signals on input wave-guides are combined together or superimposed on each other in the MMI device and travel together down output wave-guide from the MMI device. For example, when a signal with wavelength $\lambda_1$ is applied to wave-guide A and another signal with a different wavelength $\lambda_2$ is applied to wave-guide B, the output C has both signals $\lambda_1$ and $\lambda_2$.

The inventors realize that the MMI device performs the OR logic function in a way similar to a wired-OR gate that combines electrical currents. Although Y-junctions and MMI devices have been used before to combine signals in communication systems, the inventors have recognized the applicability to a binary logic circuit. In particular, when two signals combine, it doesn't matter from a binary-logic point of view that there is twice as much light. As long as the light is more than a high threshold, it is a logic 1, whether it is at the threshold or twice the threshold. When there is light from only one input, the output is still a logic one. When both inputs are dark, or 0, the output is 0. Thus, the Y junction or MMI device functions as a logic OR when placed between two logic inputs and an output.

FIG. 1 illustrates a prior-art wavelength converter. While SOA's are commonly used to boost optical power, they can also be used as wavelength converters. A modulated signal at wavelength $\lambda_1$ is to be converted to a different wavelength $\lambda_2$. The modulated signal M*$\lambda_1$ (or M$\lambda_1$) is input from waveguide input 19 to active layer 12A of SOA 12. The modulation M is the signal information that is carried by the optical wave of wavelength $\lambda_1$ and for binary signals M alternates high and low for different periods of time to carry the data.

A continuous-wave (CW) signal at wavelength $\lambda_2$ is also input to active layer 12A of SOA 12 over input 14 waveguide. This signal is labeled as 1*$\lambda_2$ since the CW signal is not modulated but always in the high (logic 1) state. The two signals can be combined by a Y-junction and then travel through active layer 12A together.

Normally, the optical weaves that emerge from active layer 12A are amplified by the lasing action. However, carrier depletion in active layer 12A occurs when too much optical power is introduced into active layer 12A. This can occur when both optical input signals are high. When carrier depletion occurs, most of the excited electrons at the higher energy levels have already been stimulated to fall to the lower level. Thus there are not enough excited electrons to emit photons. Amplification of the light waves passing through active layer 12A is thus reduced when carrier depletion occurs.

Carrier depletion in SOA 12 occurs when both inputs 19, 14 are at full power, and the result is a limiting of optical amplification. Since CW signal 1$\lambda_2$ is always high, carrier depletion occurs when modulated signal M$\lambda_1$ is high, but carrier depletion does not occur when modulated signal M$\lambda_1$ is low. The result is that optical amplification by SOA 12 is reduced when M is high, but not when M is low. The optical signal gain emerging from SOA 12 is obtained most when M is low, but least when M is high. When appropriate power levels of signal inputs 19, 14 are applied, modulated signal M$\lambda_1$ is inverted.

This phenomenon is known as cross-gain modulation (XGM). The optical signal emerging from SOA 12 on waveguide output 16 contains both wavelengths $\lambda_1$ and $\lambda_2$. However, since carrier depletion affects both wavelengths, and occurs when M is high, the modulation on wavelength $\lambda_1$ reduces gain of wavelength $\lambda_2$. When M is high, carrier depletion occurs and the gain of CW signal $\lambda_2$ is reduced. Thus optical output signal $\lambda_2$ has reduced power when the optical input signals M$\lambda_1$ is high. The modulation M is inverted on the $\lambda_2$ signal that emerges from SOA 12 on output 16.

Filter 15 blocks wavelength $\lambda_1$ from output 16, but passes wavelength $\lambda_2$. The optical signal output by filter 15 is the $\lambda_2$ signal inversely modulated by M. Thus output 20 is optical signal M'$\lambda_2$.

Figure 2:
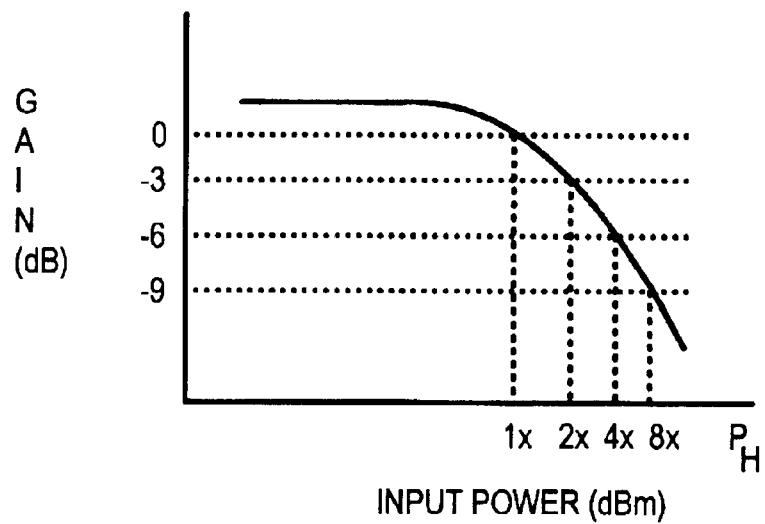
FIG. 2 is a graph of the gain of a power-restoring semiconductor optical amplifier (SOA) as a function of input power.

FIG. 2 is a graph of the gain of a power-restoring semiconductor optical amplifier (SOA) as a function of input power for optical logic computation. The novelty in the design is such that the SOA operates in a desired saturation region such that the output optical logic 1 level will maintain a target power level 1*$P_H$ regardless of the input power level. In the FIG. 2, a gain of 0 dB occurs at input power 1*$P_H$, a gain of 3.01 dB occurs at input power 2*$P_H$, a gain of 6.02 dB occurs at input power 4*$P_H$ and a gain of 9.032 dB occurs at input power 8*$P_H$, etc. The wavelengths used in optical logic computation are not limited to UV-visible or near infrared. The operating power consumed in optical logic computation is small. Of course, the SOA can deviate from the ideal gain curve and still be useful in practical applications.

Figure 3A:
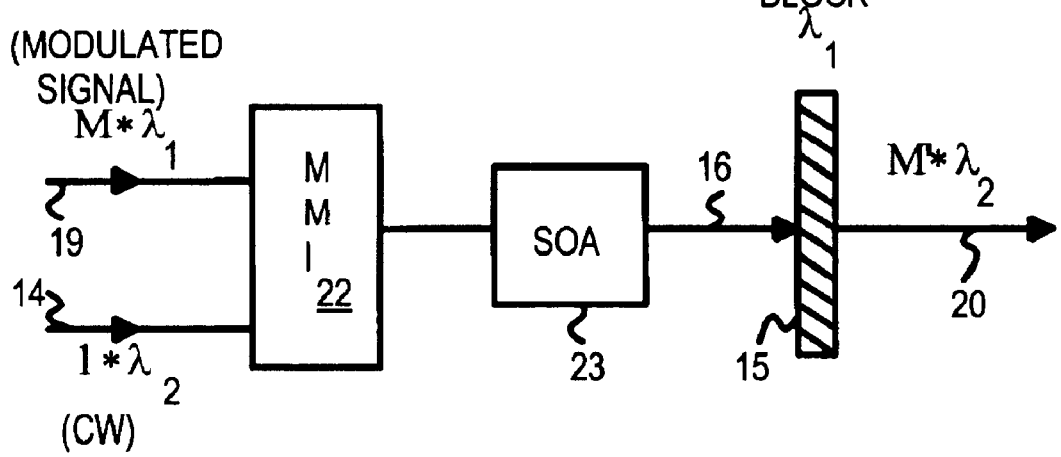
FIG. 3A shows an optical inverter using an MMI device and a SOA.

FIG. 3A shows an optical inverter using an MMI device and a SOA. The modulated (signal) input 19 is combined with continuous-wave input 14 by MMI device 22. Interference within MMI device 22 combines both wavelengths $\lambda_1$ and $\lambda_2$ in the output of MMI device 22.

The combined output from MMI device 22 is input to SOA 23. The input power of inputs 19, 14 are carefully chosen so that the output from MMI device 22 causes SOA 23 to have gain saturation when input 19 is high (lit), but no gain saturation when input 19 is low (dark). Thus gain saturation in SOA 23 causes its combined input to be logically inverted. Output 16 from SOA 23 is then filtered by filter 15 which passes wavelength $\lambda_2$ but blocks wavelength $\lambda_1$.

Gain saturation in SOA 23 causes cross-gain modulation (XGM). The optical output signal emerging from SOA 23 on waveguide output 16 contains both wavelengths $\lambda_1$ and $\lambda_2$. However, since carrier depletion affects both wavelengths, and occurs when M is high, the modulation on wavelength $\lambda_1$ reduces gain of wavelength $\lambda_2$. When M is high, carrier depletion occurs and the gain of CW signal $\lambda_2$ is reduced. Thus optical signal has reduced power when signals M$\lambda_1$ is high. The modulation is inverted on the $\lambda_2$ signal that emerges from SOA 22 on output 16. SOA 23 also operates to restore the power level to a target high/low level.

Filter 15 blocks wavelength $\lambda_1$ from output 16, but passes wavelength $\lambda_2$. The optical signal output by filter 15 is the $\lambda_2$ signal inversely modulated by M. Thus output 20 is optical signal M'$\lambda_2$.

Figure 3B:
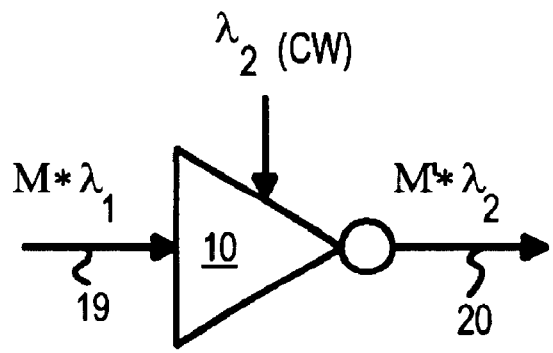
FIG. 3B highlights that the SOA and filter of FIG. 3A act as an optical inverter.

FIG. 3B highlights that SOA 23 and filter 15 of FIG. 3A act as optical inverter 10. The modulated signal M on input 19 is inverted to produce output 20, which carrier signal M'$\lambda_2$. However, wavelength conversion also occurs, since the modulation M is transferred from wavelength $\lambda_1$ to wavelength $\lambda_2$.

Figure 4:
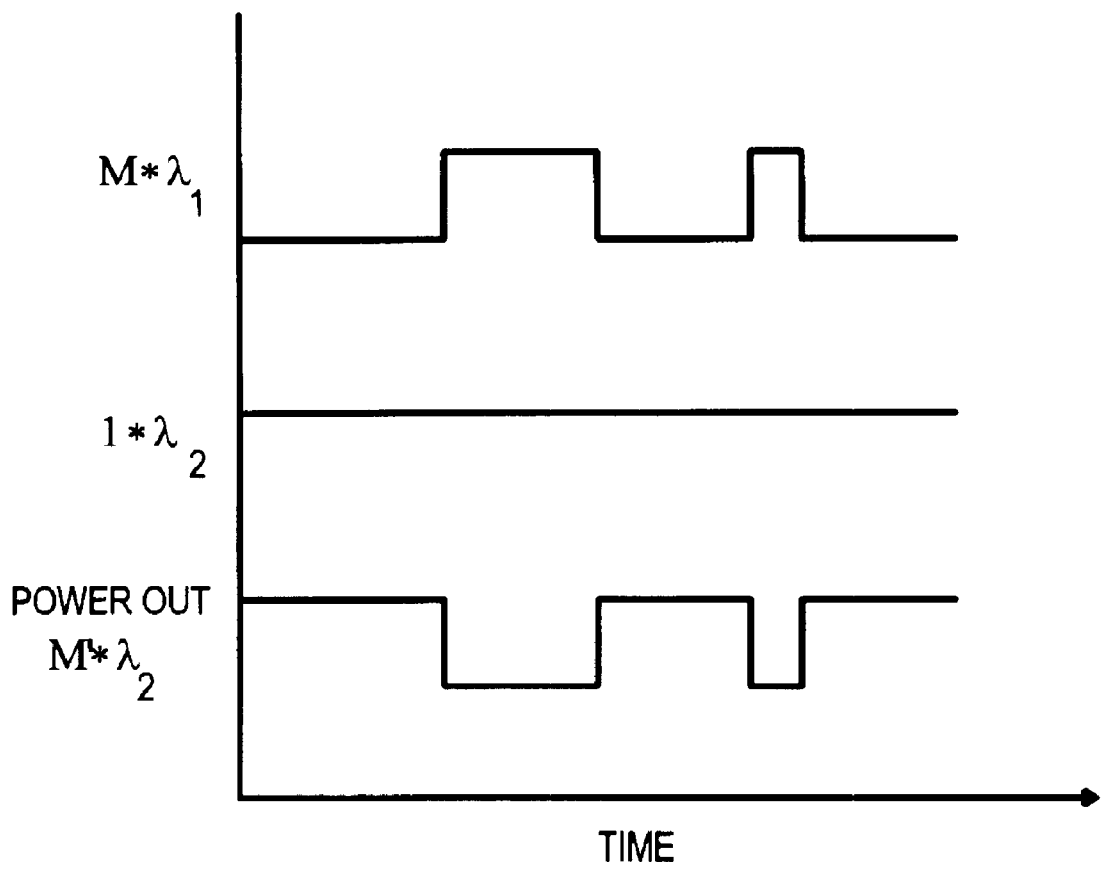
FIG. 4 shows waveforms of a semiconductor optical amplifier (SOA) operating as an optical inverter.

FIG. 4 shows waveforms of a semiconductor optical amplifier (SOA) operating as an optical inverter. Two optical signals are input to the active region of the SOA: a modulated signal M$\lambda_1$ and a continuous-wave (CW) signal 1$\lambda_2$. The first waveform, M$\lambda_1$, is high when M is one, indicating the presence of an optical signal of wavelength $\lambda_1$ is present, and low when the optical signal of wavelength $\lambda_1$ is dark (not present). Thus the first waveform indicated the presence or absence of the optical signal at wavelength $\lambda_1$. Two pulses of the optical signal at wavelength $\lambda_1$ occur during the time shown in FIG. 4, one wide and one narrow pulse high.

The second optical signal, 1$\lambda_2$, is always present, since it is continuous. Thus a high waveform is shown for all time periods in FIG. 4 for the second waveform.

The carrier density becomes depleted when two high optical power inputs are applied to the active layer of the SOA. The power levels of the two signals of wavelengths $\lambda_1$ and $\lambda_2$ are selected so that each signal alone is not powerful enough to deplete the carriers in the SOA. However, when both signals are high, carrier depletion occurs.

The carrier density drops off when both inputs are high. When $M\lambda_1$ is high (the first optical signal is present) the carriers become depleted and the carrier density falls. Since $1\lambda_2$ is a continuous wave (always present), carrier density is a function of the first input $M\lambda_1$.

When the carrier density falls, the number of photons emitted is reduced. The amplification of the optical signals depends on photon emission in the SOA, so the amplification or optical gain falls when the carrier density falls.

The filtered optical signal has a low power when carrier depletion and gain reduction occur, but a higher power when carrier depletion does not occur. Thus the output signal $M'\lambda_2$ pulses low when modulated input $M\lambda_1$ pulses high. The modulated input signal $M\lambda_1$ is inverted in logical state and converted from wavelength $\lambda_1$ to wavelength $\lambda_2$ by cross-gain modulation.

Figure 5:
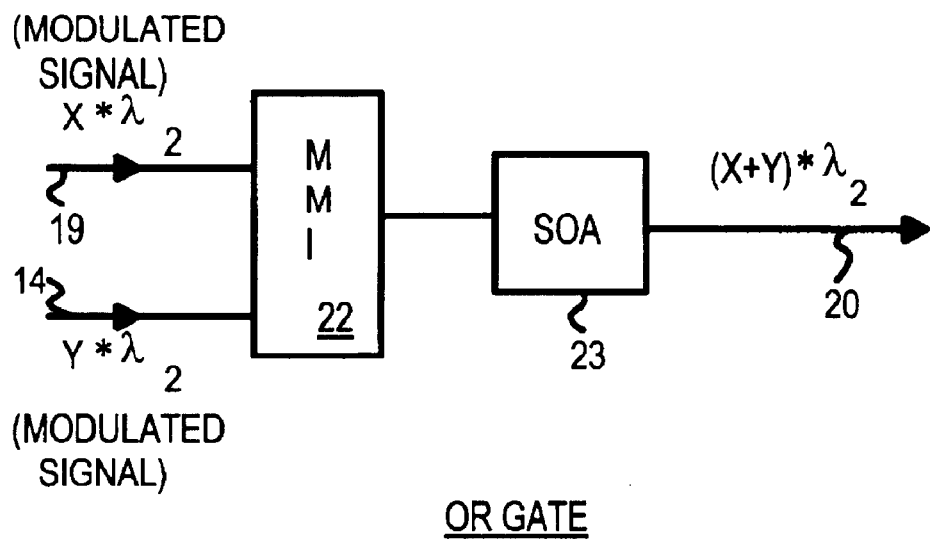
FIG. 5 is an optical OR gate.

FIG. 5 is an optical OR gate. Modulated optical signals X and Y applied to inputs 19, 14 respectively. MMI device 22 combines these inputs to drive SOA 23. SOA 23 operates to restore the power level to a target high level when either or both of inputs 19, 14 are high. The final output 20 is the OR function, $(X+Y)\lambda_2$.

Figure 6:
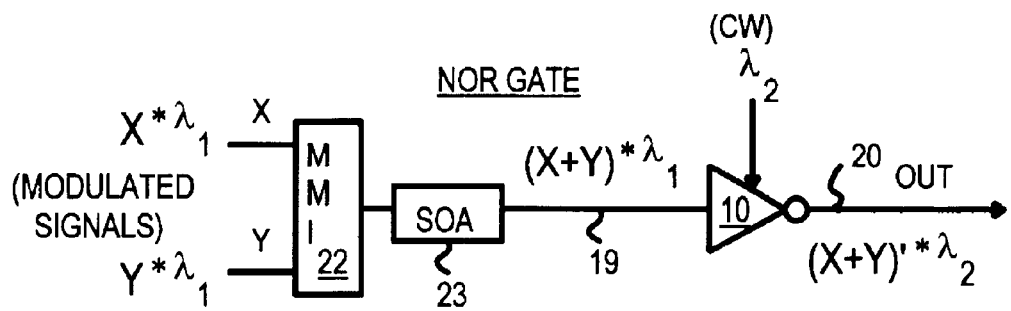
FIG. 6 is an optical NOR gate constructed from an optical MMI device and an optical inverter.

FIG. 6 is an optical NOR gate constructed from an optical MMI device and optical inverter. Two modulated inputs both at wavelength $\lambda_1$ are input on optical lines X, Y. The two optical signals $X\lambda_1$ and $Y\lambda_1$ are combined by MMI device 22 and restored to a target power level by SOA 23 to produce first input 19 to optical inverter 10. MMI device 22 and SOA 23 act as an optical equivalent to a wired-OR gate, outputting signal $(X+Y)\lambda_1$ onto first input 19.

SOA 23 is also operated to restore the power levels to a target high power level $P_H$. When both inputs X and Y are at the high power level $P_H$, the combined signal from MMI device 22 can have a double-power level $2*P_H$. SOA 23 restores the optical signal to the $1*P_H$ level. SOA 23 thus acts to restore the power levels to the target level, allowing for better logic integration. SOA 23 can be designed and operated to operate with the desired gain for power levels $1*P_H$ and $2*P_H$ to output $1*P_H$. The injected bias current to SOA 23 can be adjusted to operate SOA 23 in the desired region of the non-linear gain curve. This maintains the desired extinction ratio.

Optical inverter 10 is another SOA that uses cross-gain modulation to logically invert the modulated input signal on first input 19 and convert it to wavelength $\lambda_2$. A continuous-wave signal at wavelength $\lambda_2$ is input to optical inverter 10 as the second input.

Optical inverter 10 uses cross-gain modulation to invert the modulation of first input 19, and apply the inverted modulation to output 20. Thus optical inverter 10 outputs signal $(X+Y)'\lambda_2$. The modulated signals X and Y input to MMI device 22 each independently pulse high and low over time to carry data. Output 20 likewise pulses low and high as a function of X and Y. The function is the logical NOR of X, Y, $(X+Y)'$. Thus a logical NOR gate is constructed from MMI Adevice 22, SOA 23, and optical inverter 10. SOA 23 operates to restore to a target level. SOA 10 operates to restore to the target power level as well as acting as an inverter.

Figure 7:
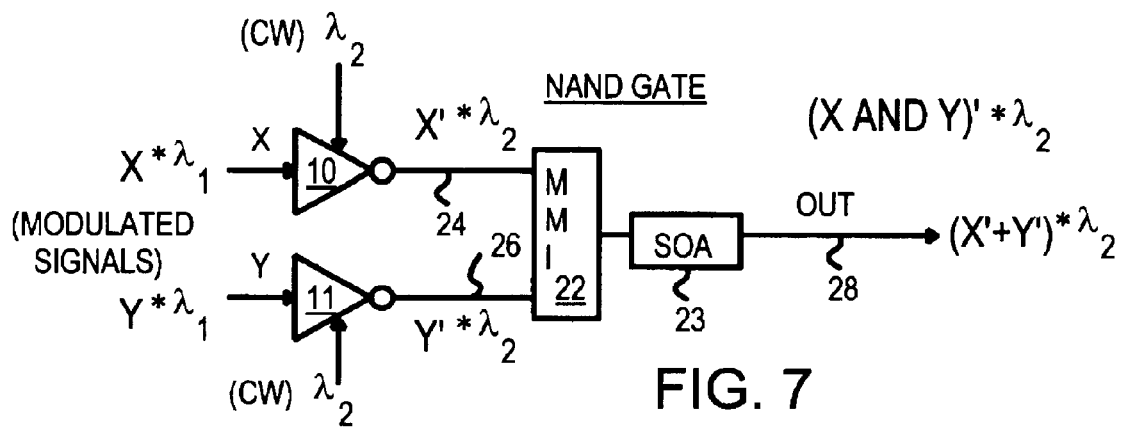
FIG. 7 shows an optical NAND gate using optical inverters and an MMI device.

FIG. 7 shows an optical NAND gate using optical inverters and an MMI device. Two optical inverters 10, 11 have their inputs coupled to inputs X and Y, respectively, and their outputs 24, 26 connected to MMI device 22 which drives SOA 23. SOA 23 thus operates to restore to the target level.

Optical inverter 10 receives modulated optical signal $X\lambda_1$ and continuous signal $\lambda_2$ and generates $X'\lambda_2$ on intermediate output 24. Likewise, optical inverter 11 receives modulated optical signal $Y\lambda_1$ and continuous signal $\lambda_2$ and generates $Y'\lambda_2$ on intermediate output 26. X and Y are modulation coefficients that vary with time and are normally independent of each other.

Optical MMI device 22 combines the optical signals from intermediate outputs 24, 26. SOA 23 restores the power level to generate the final output 28. MMI device 22 performs an OR function, combining signals on outputs 24, 26. When one or both of the signals on intermediate outputs 24, 26 are high (optical wave present or above a threshold power), then output 28 is also high. When both intermediate outputs 24, 26 are low (dark or below a threshold power), then their combination, output 28, is also low (dark).

Since the signal on output 28 is $(X'+Y')\lambda_2$, a logical NAND function is performed. DeMorgan's theorem shows than $(X'+Y')$ is equivalent to $(A\ AND\ B)'$.

Figure 8:
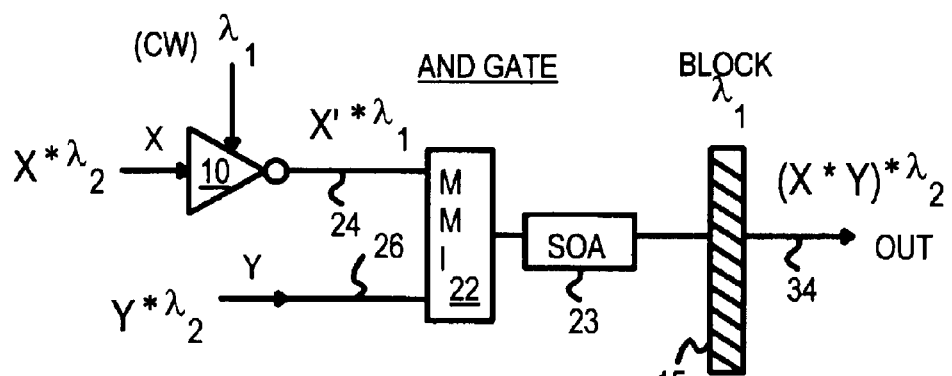
FIG. 8 is an optical AND gate.

FIG. 8 is an optical AND gate. First modulated signal $X\lambda_2$ is inverted by optical inverter 10 to generate signal $X'\lambda_1$ on intermediate signal 24. Second modulated signal $Y\lambda_2$ is input on intermediate signal 26. Optical MMI device 22 combines intermediate outputs 24, 26, and the combined output is inverted to $X'*\lambda_1$ and also restored to the target power level by SOA 23. Filter 15 blocks wavelength $\lambda_1$ to generate $(X*Y)\lambda_1$ on final output 34. A logical AND function is performed.

From these basic optical gates, OR, NOR, NAND, AND and inverter, arbitrary combinatorial logic functions can be constructed. Thus relatively complex logic can be implemented in the optical domain, with requiring conversion to electrical signals.

Alternate Embodiments

Several other embodiments are contemplated by the inventors. Rather than use a MMI device with 2 inputs and 1 output, larger MMI devices could be used, such as one that has two, three or more inputs. This allows for 3-input logic gates, or even larger logic functions with multiple inputs. The output can be split into 2 or more outputs. Semiconductor optical amplifiers (SOA's) can be constructed from a variety of materials and are not restricted to the semiconductor materials described in the example.

One benefit of using semiconductor optical amplifiers (SOAs) for optical inverters is that SOA's are inherently amplifying devices. Power levels are restored or boosted by the optical inverters, compensating for any losses. Thus the optical logic using optical inverters is self-restoring. The power levels of the inputs to the optical inverters can be adjusted to vary the amplification, and the SOA's themselves may be modified or optimized in a variety of ways to adjust amplification.

Rather than be completely dark when the modulated input or output is low, the optical power may be low but still somewhat present. The low optical power can be detected as a low if the optical power is below a threshold of a sensor. The optical inverter can still be useful even when the output is still somewhat on for logic 0.

Instead of using two complementary types of inverters, three or more types of inverters could be used with three or more wavelengths. For example, a first inverter type could convert from a first to a second wavelength, while a second inverter type could convert from the second to a third wavelengths. A third inverter type could convert from the third wavelength back to the first wavelength. Additional inverter types can be added as additional wavelengths are used.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word 'means' is recited in a claim element, Applicant intends for the claim element to fall under 35 USC §112, paragraph 6. Often a label of one or more words precedes the word 'means'. The word or words preceding the word 'means' is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An optical OR gate comprising:
   first and second optical guides for receiving modulated optical signals as inputs to the optical OR gate;
   a junction, coupled to the first and second optical guides for combining modulated optical signals to produce a combined optical signal; and
   a semiconductor optical amplifier (SOA), coupled to the junction to receive the combined optical signal, for restoring a power level of the combined optical signal to generate an output optical signal;
   wherein when both the first and second optical guides receive modulated optical signals at a high power level, the SOA receives a combined optical signal with a power of about double the high power level, the SOA generates the output optical signal with a power of about the high power level, while when either of the first and second optical guides receive modulated optical signals at a high power level, the SOA generates the output optical signal with a power of about the high power level, while when both of the first and second optical guides receive modulated optical signals at a low power level, the SOA generates the output optical signal with a power of about the low power level,
   whereby power levels are restored for the output optical signal which is a logical OR of the modulated optical signals on the fast and second optical guides.

2. The optical OR gate of claim 1 wherein the junction is a Y-junction.

3. The optical OR gate of claim 2 wherein the junction is a multi-mode interference (MMI) device.

4. The optical OR gate of claim 3 wherein the modulated optical signals alternate between a logical low state wherein optical power is. below a threshold, the logical low state being a relatively dark state, and a logical high state wherein optical power is above the threshold, the logical high state being a relatively bright state,
   whereby optical power is modulated.

5. An optical NOR gate comprising:
   an optical OR gate that comprises:
      first and second optical guides for receiving modulated optical signals as inputs to the optical OR gate;
      a first junction, coupled to the first and second optical guides for combining modulated optical signals to produce a combined optical signal; and
      a semiconductor optical amplifier (SOA), coupled to the first junction to receive the combined optical signal, for restoring a power level of the combined optical signal to generate an output optical signal;
   an optical inverter that comprises:
      a third optical guide for receiving the combined optical signal from the SOA in the optical OR gate;
      a fourth optical guide for receiving a continuous-wave input;
      a second junction, coupled to the third and fourth optical guides for combining the continuous-wave input and the combined optical signal to produce an intermediate optical signal; and
      a second SOA, coupled to the second junction to receive the intermediate optical signal, for restoring a power level of the intermediate optical signal to generate an output optical signal;
   wherein the output optical signal is a logical NOR of the modulated optical signals on the first and second optical guides.

6. The optical NOR gate of claim 5 wherein the first and second junctions are multi-mode interference (MMI) devices.

7. The optical NOR gate of claim 6 wherein the second SOA is further for inverting modulation of the combined optical signal, the second SOA being configured as a cross gain amplifier.

8. The optical NOR gate of claim 7 wherein the second SOA comprises an active layer that receives a modulated-signal input and the continuous-wave input, the active layer having excited electrons that emit photons when stimulated by an optical signal from the modulated-signal input, the photons amplifying an output optical signal,
   whereby the active layer of the SOA amplifies optical signals by stimulated photon emission.

9. The optical NOR gate of claim 8 wherein carrier depletion in the active layer occurs when both the continuous-wave input and the modulated-signal input to the active layer are optical signals above a logical-high threshold level;
   wherein gain is reduced when carrier depletion occurs;
   wherein the output optical signal is below a logical-low threshold level when carrier depletion occurs;
   whereby modulation of the modulated-signal input is inverted by the SOA.

10. The optical NOR gate of claim 9 wherein the second SOA further comprises a filter, coupled to remove an optical signal having a first wavelength of the modulated-signal input from the output optical signal;
   wherein the output optical signal has a second wavelength of the continuous-wave input, but a modulation inverted from the modulated-signal input.

11. The optical NOR gate of claim 10 wherein the modulated optical signals on the first and second optical guides have a second wavelength that differs from the fist wavelength.

12. The optical NOR gate of claim 6 wherein the optical guides are optical fibers or are waveguides in a substrate material or a semiconductor material.

13. An optical NAND gate comprising:
  a first optical inverter connected to a first NAND gate input;
  a second optical inverter connected to a second NAND gate input;
  a first optical guide connected to an output of the first optical inverter;
  a second optical guide connected to an output of the second optical inverter; and
  a third optical guide, having an input connected to the first and second optical guides as a gate junction, and an output connected to an output of the optical NAND gate;
  wherein the output of the optical NAND gate represents a logical NAND of optical signals input to the first and second NAND gate inputs;
  wherein the gate junction is a multi-mode interference (MMI) device;
  wherein at least one of the optical inverters comprises:
    a MMI junction that receives a continuous-wave input and a signal input, the MMI junction generating a combined output;
    a SOA receiving the combined output and being configured as a cross gain amplifier wherein modulation of an optical signal from the signal input is inverted and transferred to an inverter output having a wavelength of the continuous-wave input,
    whereby the SOA inverts modulation of the signal input and converts wavelengths.

14. The optical NAND gate of claim 13 wherein the first NAND gate input and the second NAND gate input each receive optical signals having a first wavelength;
  wherein the first and second optical inverters output optical signals having a second wavelength, the second wavelength being a wavelength of an optical signal at the output of the optical NAND gate,
  whereby conversion from the first wavelength to the second wavelength occurs.

15. The optical NAND gate of claim 14 wherein the first and second optical inverters are each semiconductor optical amplifiers with continuous-wave inputs receiving un-modulated optical signals having the second wavelength.

16. The optical NAND gate of claim 15 further comprising:
  a third SOA, coupled to receive the output of the optical NAND gate, for restoring a power level of the output of the NAND gate to generate a restored-power output optical signal.

17. An optical inverter comprising:
  a first optical guide for receiving a modulated optical signal;
  a second optical guide for receiving a continuous-wave input;
  a junction, coupled to the first and second optical guides for combining the continuous-wave input and the modulated optical signal to produce an intermediate optical signal; and
  a semiconductor-optical amplifier (SOA), coupled to the junction to receive the intermediate optical signal, for inverting modulation of the modulated optical signal and for restoring a power level of the intermediate optical signal to generate an output optical signal.

18. An optical AND gate comprising:
  a first semiconductor-optical amplifier (SOA) connected to a first AND gate input and being configured as a cross gain amplifier wherein modulation of an optical signal from the firs AND gate input is inverted and transferred to an inverter output having a wavelength of a continuous-wave input to the first SOA;
  wherein the first SOA inverts modulation of the first AND gate input;
  a multi-mode interference (MMI) device coupled to receive a second AND gate input having the wavelength of the continuous-wave input to the first SOA and coupled to receive the inverter output from the first SOA, the MMI device generating a combined output;
  a second SOA, coupled to receive the combined output from the MMI device, for restoring a power level to generate an intermediate output; and
  a filter, coupled to the second SOA, for passing optical signals having a wavelength of the first AND gate input, but for blocking the wavelength of the continuous-wave input to the first SOA,
  wherein the output of the optical AND gate represents a logical AND of the first and second AND gate inputs.

* * * * *